United States Patent
Son

(10) Patent No.: US 9,812,595 B1
(45) Date of Patent: Nov. 7, 2017

(54) ALL-WAVELENGTH (VIS-LWIR) TRANSPARENT ELECTRICAL CONTACTS AND INTERCONNECTS AND METHODS OF MAKING THEM

(71) Applicant: HRL Laboratories, LLC, Malibu, CA (US)

(72) Inventor: Kyung-Ah Son, Moorpark, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 15/359,532

(22) Filed: Nov. 22, 2016

Related U.S. Application Data

(62) Division of application No. 14/530,365, filed on Oct. 31, 2014, now Pat. No. 9,548,415.

(51) Int. Cl.
| | |
|---|---|
| *H01B 5/00* | (2006.01) |
| *B32B 37/12* | (2006.01) |
| *B82Y 30/00* | (2011.01) |
| *H05K 1/03* | (2006.01) |
| *H05K 1/09* | (2006.01) |
| *H05K 3/10* | (2006.01) |
| *H01L 31/0224* | (2006.01) |
| *H01L 31/18* | (2006.01) |

(Continued)

(52) U.S. Cl.
CPC .. *H01L 31/022491* (2013.01); *H01L 27/1446* (2013.01); *H01L 31/02019* (2013.01); *H01L 31/02161* (2013.01); *H01L 31/02966* (2013.01); *H01L 31/0304* (2013.01); *H01L 31/03046* (2013.01); *H01L 31/035236* (2013.01); *H01L 31/1864* (2013.01); *H01L 31/1868* (2013.01); *H01L 31/1884* (2013.01)

(58) Field of Classification Search
CPC ......... H01L 31/022466; H01L 31/1884; H01L 31/022491
USPC .... 257/13, 29, 40, 94–95, E29.07, E33.074; 438/47, 82, 479
See application file for complete search history.

(56) References Cited

U.S. PATENT DOCUMENTS

| 8,022,390 B1 | 9/2011 | Kim et al. |
| 9,548,415 B1 | 1/2017 | Son |

(Continued)

OTHER PUBLICATIONS

From U.S. Appl. No. 14/183,237 (Unpublished, Non Publication Requested), Final Rejection dated Oct. 12, 2016.

(Continued)

*Primary Examiner* — Duy T Nguyen
*Assistant Examiner* — Brian Turner
(74) *Attorney, Agent, or Firm* — Ladas & Parry

(57) ABSTRACT

A method for fabricating an optically transparent conductor including depositing a plurality of metal nanowires on a substrate, annealing or illuminating the plurality of metal nanowires to thermally or optically fuse nanowire junctions between metal nanowires to form a metal nanowire network, disposing a graphene layer over the metal nanowire network to form a nanohybrid layer comprising the graphene layer and the metal nanowire network, depositing a dielectric passivation layer over the nanohybrid layer, patterning the dielectric passivation layer using lithography, printing, or any other method of patterning to define an area for the optically transparent conductor, and etching the patterned dielectric passivation layer to define the optically transparent conductor.

21 Claims, 12 Drawing Sheets

(51) Int. Cl.
*H01L 31/0304* (2006.01)
*H01L 31/0296* (2006.01)
*H01L 31/0352* (2006.01)
*H01L 31/0216* (2014.01)
*H01L 27/144* (2006.01)
*H01L 31/02* (2006.01)

(56) References Cited

U.S. PATENT DOCUMENTS

| | | | |
|---|---|---|---|
| 2003/0079999 | A1 | 5/2003 | Penner et al. |
| 2004/0046123 | A1 | 3/2004 | Dausch |
| 2007/0032091 | A1* | 2/2007 | Heald ............... H01L 21/28273 438/758 |
| 2010/0243295 | A1* | 9/2010 | Allemand ............ B82Y 10/00 174/250 |
| 2011/0281070 | A1 | 11/2011 | Mittal et al. |
| 2012/0007118 | A1 | 1/2012 | Choi et al. |
| 2012/0107598 | A1 | 5/2012 | Zou et al. |
| 2012/0264254 | A1 | 10/2012 | Wan |
| 2013/0048339 | A1 | 2/2013 | Tour et al. |
| 2013/0102109 | A1 | 4/2013 | Stewart et al. |
| 2013/0221219 | A1 | 8/2013 | Torabi |
| 2013/0341074 | A1* | 12/2013 | Virkar .................... B82Y 30/00 174/255 |
| 2014/0034976 | A1 | 2/2014 | Chu et al. |
| 2014/0084266 | A1 | 3/2014 | Yang et al. |
| 2014/0264270 | A1* | 9/2014 | Dutta ............... H01L 27/14636 257/14 |
| 2015/0056435 | A1* | 2/2015 | Hsu ......................... H01B 1/02 428/298.1 |
| 2015/0084002 | A1 | 3/2015 | Song et al. |
| 2015/0280011 | A1 | 10/2015 | Cho et al. |

OTHER PUBLICATIONS

From U.S. Appl. No. 14/183,237 (Unpublished, Non Publication Requested), Final Rejection dated Oct. 15, 2015.
From U.S. Appl. No. 14/183,237 (Unpublished, Non Publication Requested), Non-Final Rejection dated Jul. 28, 2016.
From U.S. Appl. No. 14/183,237 (Unpublished, Non Publication Requested), Non-Final Rejection dated Jun. 23, 2015.
From U.S. Appl. No. 14/183,237 (Unpublished, Non Publication Requested), Notice of Allowance dated Dec. 19, 2016.
From U.S. Appl. No. 14/530,365 (Now U.S. Pat. No. 9,548,415), Advisory Action dated Aug. 8, 2016.
From U.S. Appl. No. 14/530,365 (Now U.S. Pat. No. 9,548,415), Final Office Action dated Jul. 27, 2015.
From U.S. Appl. No. 14/530,365 (Now U.S. Pat. No. 9,548,415), Final Rejection dated Jun. 1, 2016.
From U.S. Appl. No. 14/530,365 (Now U.S. Pat. No. 9,548,415), Non-Final Office Action dated Apr. 17, 2015.
From U.S. Appl. No. 14/530,365 (Now U.S. Pat. No. 9,548,415), Non-Final Rejection dated Jan. 6, 2016.
From U.S. Appl. No. 14/530,365 (Now U.S. Pat. No. 9,548,415), Notice of Allowance dated Sep. 8, 2016.
From U.S. Appl. No. 14/530,365 (Now U.S. Pat. No. 9,548,415), Restriction Requirement dated Jan. 26, 2015.
U.S. Appl. No. 14/183,237, filed Feb. 18, 2014, Son et al.
T. Chen, T. Ma, R.C. Barker, "Infrared Transparent and Electrically Conductive Thin Film of $In_2O_3$", Applied Physics Letters 43, No. 10, pp. 901-903, Nov. 1983.
D.S. Ghosh, L. Martinez, S. Giurgola, P. Vergani, and V. Prneri, "Widely Transparent Electrodes Based on Ulrathin Metals", Optics Letters, vol. 34, No. 3, pp. 325-327, Feb. 1, 2009.
Z. Wu, Z. Chen, X. Du, et al., "Transparent Conductive Carbon Nanotube Films", Science, vol. 305, pp. 1273-1276, Aug. 27, 2004.
Changwook Jeong, et al., "Prospects for Nanowire-Doped Polycrystalline Graphene Films for Ultatransparent, Highly Conductive Electrodes", Nano Letters, Oct. 10, 2011, vol. 11, pp. 5020-5025.
Iskandar N. Kholmanov et al., "Improved Electrical Conductivity of Graphene Films Integrated With Metal Nanowires", Nano Letters, Oct. 20, 2012, vol. 12, pp. 5679-5683.
Mi-Sun Lee et al., "High-Performance, Transparent, and Stretchable Electrodes Using Graphene-Metal Nanowire Hybrid Structures", Nano Letters, May 2013, vol. 13, pp. 2814-2821.
Tong Lai Chen et al., "Hybrid Transparent Conductive Film on Flexible Glass Formed by Hot-Pressing Graphene on a Silver Nanowire Mesh", ACS Applied Materials & Interfaces vol. 5, Oct. 2013, pp. 11756-11761.
J.S. Moon et al., "Ultra-low Resistance OHMIC Contacts in Graphene Field Effect Transistors", Applied Physics Letters, vol. 100, May 2012, pp. 203512-1-203512-3.
Liangbing Hu, et al., "Infrared Transparent Carbon Nanotube Thin Folms", Applied Physics Letters, vol. 94, Feb. 2009, pp. 081103-1-081103-3.
Aqariden et al., "Development of Molecular Beam Epitaxially Grown Hg1-xCdxTe for High-Density Vertically-Integrated Photodiode-Based Focal Plane Arrays", Journal of Electronic Materials, vol. 36, No. 8, 2007, pp: 900-904.

* cited by examiner

+

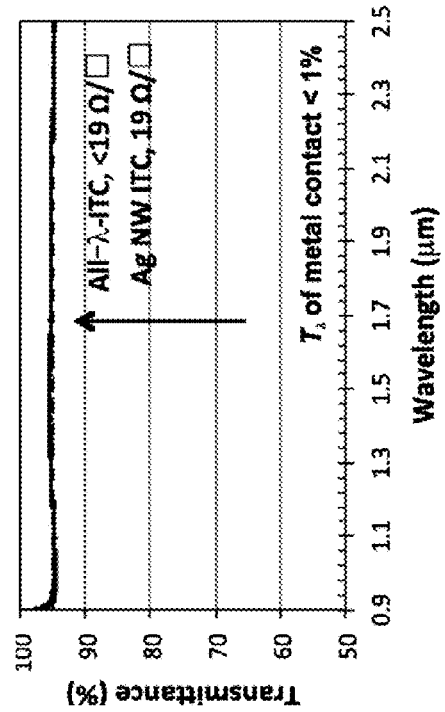
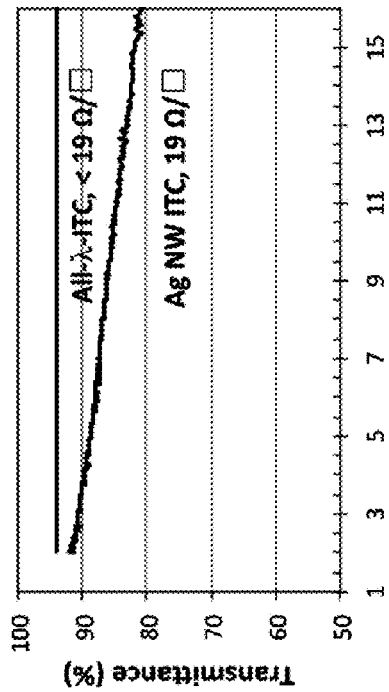
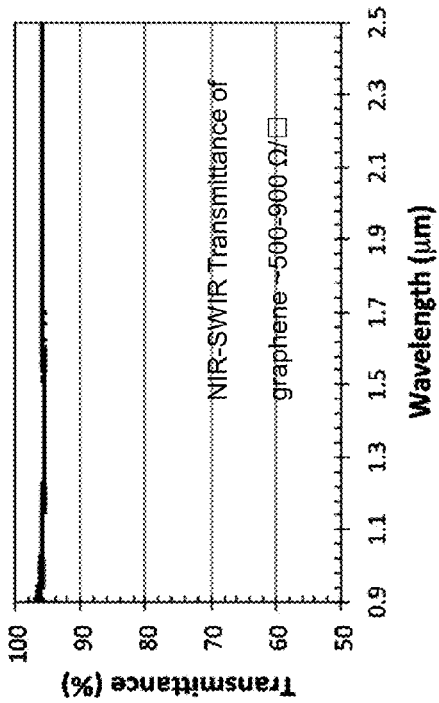
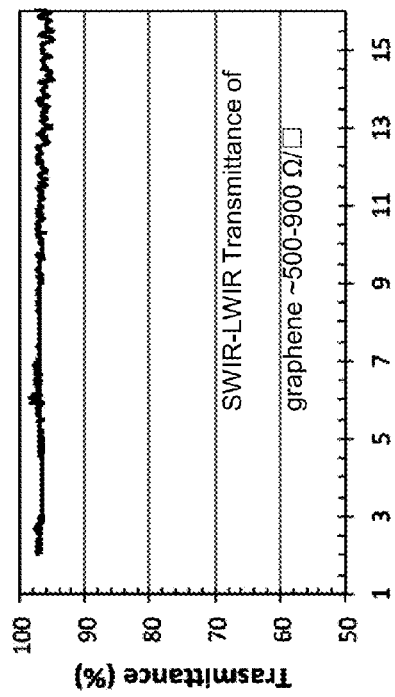
FIG. 2C
FIG. 2D
FIG. 2E
FIG. 2F

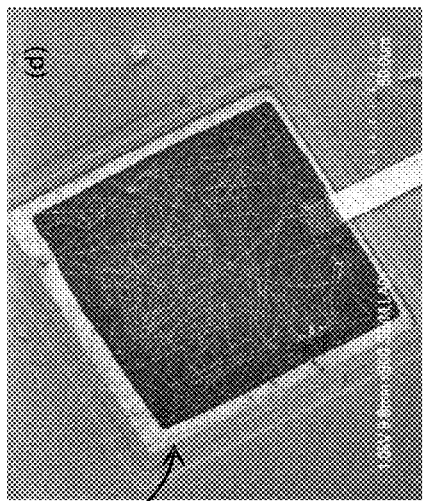
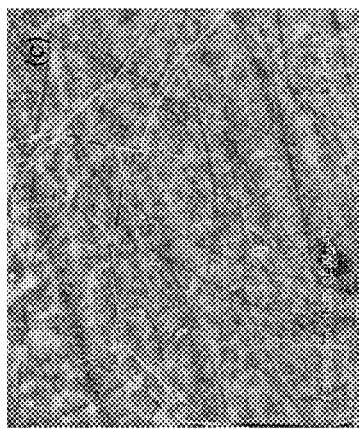
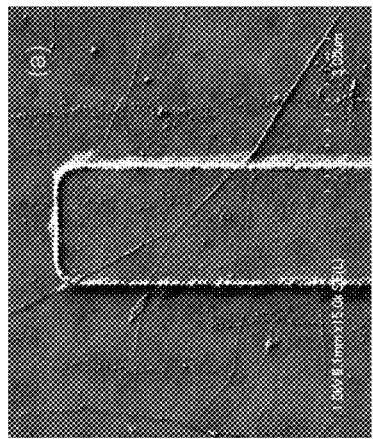 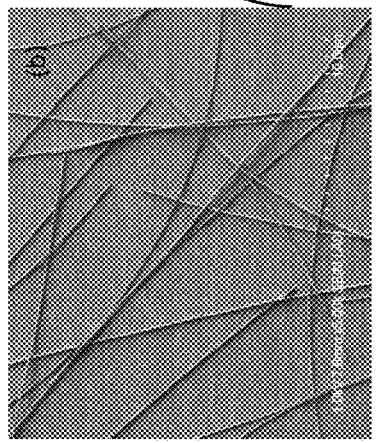
FIG. 3D
FIG. 3C
FIG. 3A    FIG. 3B

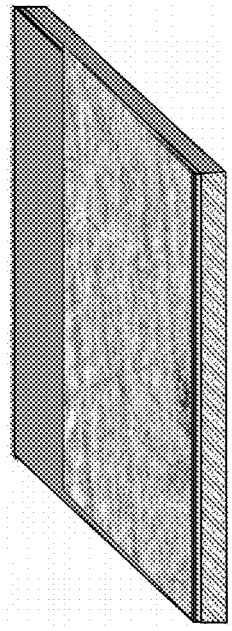

1. Deposit metal nanowires
2. Thermal/optical fusion of nanowire junctions

FIG. 4G

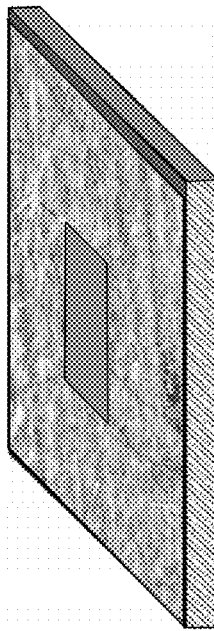

3. CVD graphene transfer

FIG. 4H

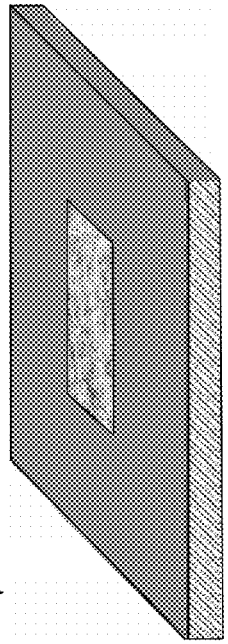

4. Dielectric passivation over nanohybrid layer of graphene and metal nanowires

FIG. 4I

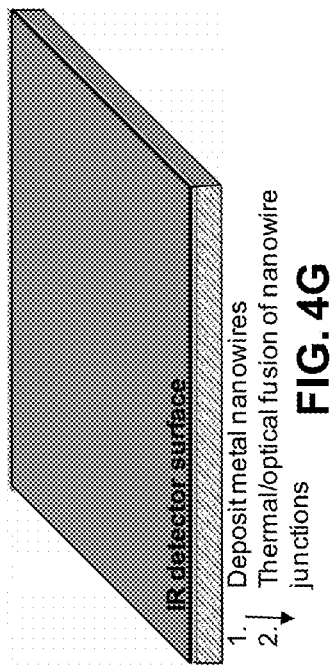

5. Pattern passivated nanohybrid layer using lithography or printing

FIG. 4J

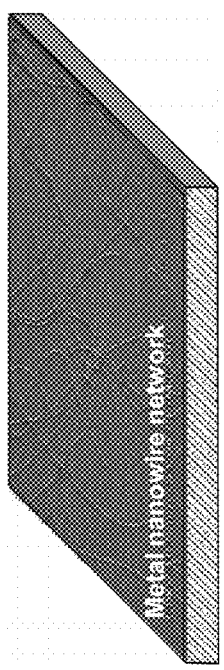

6. Dry/Wet etch to form electrical contacts, interconnects and grids

FIG. 4K

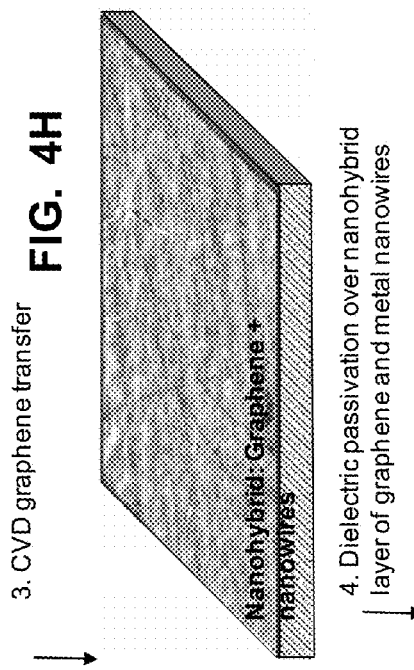

7. Optionally anneal using rapid thermal annealing

FIG. 4L

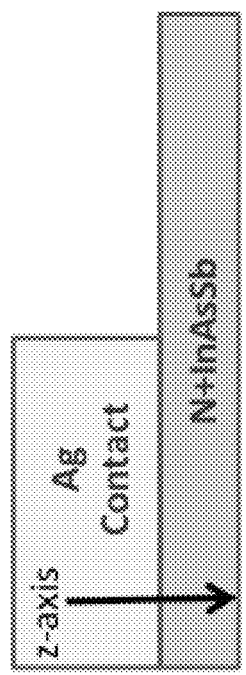
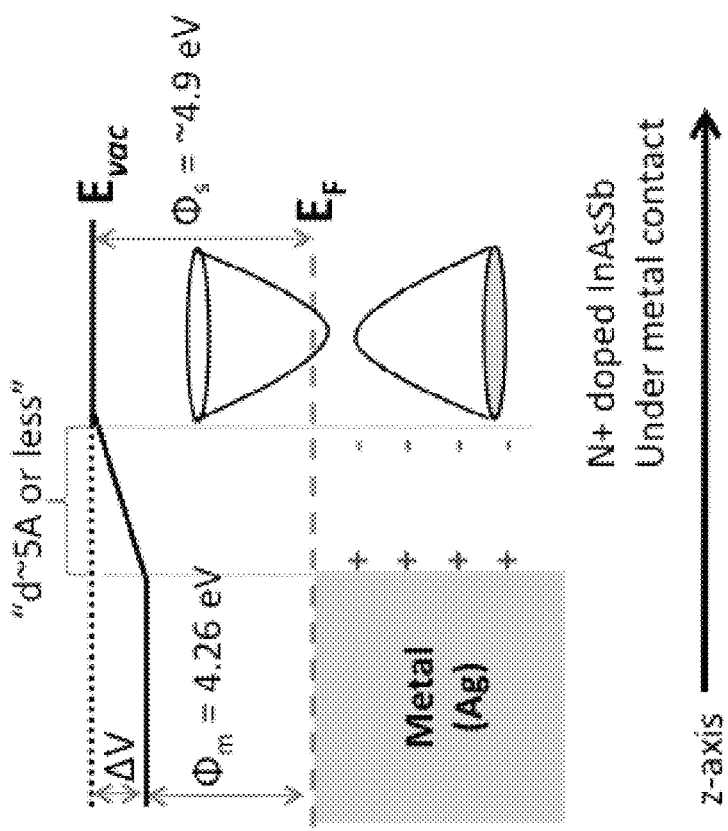
FIG. 6B
FIG. 6A

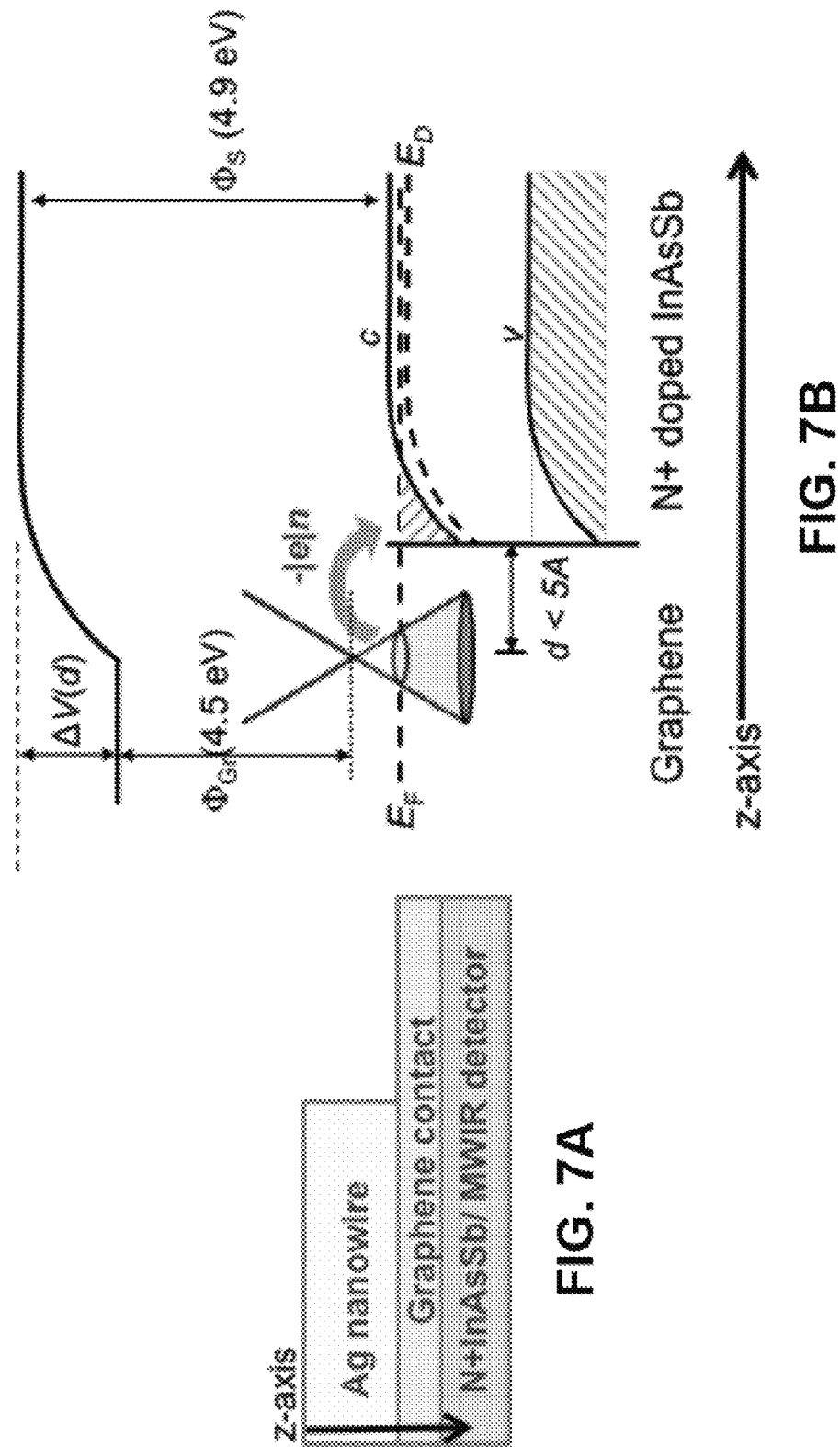

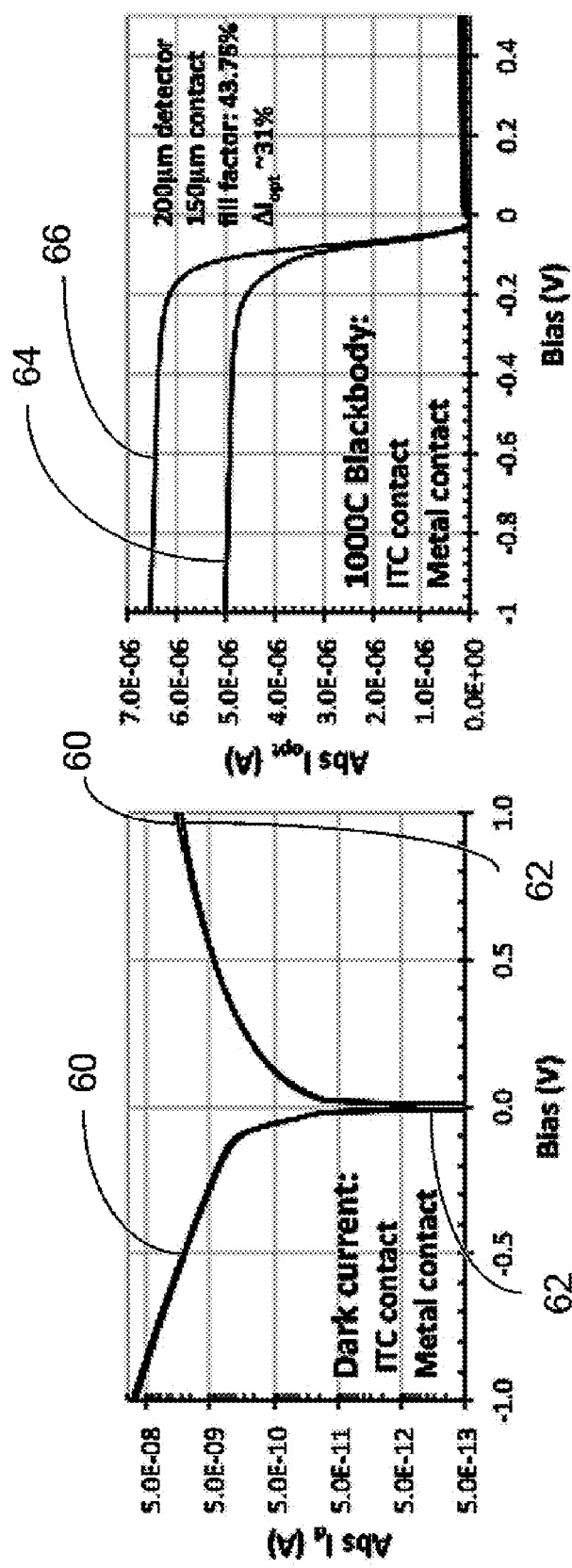

US 9,812,595 B1

ALL-WAVELENGTH (VIS-LWIR) TRANSPARENT ELECTRICAL CONTACTS AND INTERCONNECTS AND METHODS OF MAKING THEM

CROSS REFERENCE TO RELATED APPLICATIONS

This application claims the benefit of and is a divisional of U.S. patent application Ser. No. 14/530,365 filed on Oct. 31, 2014, the disclosure of which is incorporated herein by reference.

This application is related to U.S. Provisional Patent Application Ser. No. 61/766,217, filed Feb. 19, 2013, and to U.S. patent application Ser. No. 14/183,237, filed Feb. 18, 2014, which are incorporated herein by reference as though set forth in full.

STATEMENT REGARDING FEDERAL FUNDING

None

TECHNICAL FIELD

This disclosure relates to focal plane arrays (FPAs), and in particular to electrical contacts, grids and interconnects for focal plane arrays.

BACKGROUND

Advances in IR imaging technologies for high-resolution wide-area surveillance are driving small pixel, high-density, large-format infrared (IR) focal plane arrays (FPAs). However, conventional metal contacts and metal grid lines used in prior art 3D heterogeneous integration partially cover the active area of a pixel, decreasing fill factor and quantum efficiency (QE).

U.S. patent application Ser. No. 14/183,237, filed Feb. 18, 2014, which is incorporated herein by reference as though set forth in full, describes IR-transparent ohmic contacts and interconnects and silver nanowire (Ag NW) network based Infrared-transparent conductors (ITCs). Ag NW-based ITCs, however, have decreasing optical transmittance with increasing wavelength due to reflections, which are quite significant for long wavelength infrared (LWIR). Also Ag NW networks are porous, which is not ideal for making contacts on small (sub-wavelength-sized) IR pixels operating at long wavelength infrared (LWIR) wavelengths.

The prior art for IR-transparent conductors includes the following. "Widely transparent electrodes based on ultrathin metals", *Optics Letters* 34, 325 (2009), incorporated herein by reference, describes ultra thin 2 nanometer (nm) Ni films with a resistivity of $\rho \sim 200$ $\mu\Omega$ cm ($R_s \sim 1$ k$\Omega$/sq.), and an optical transmittance $T_\lambda$ of about 82% over a 400 nm-25 $\mu$m wavelength range. "Transparent, Conductive Carbon Nanotube Films", *Science* 305, 1273 (2004), incorporated herein by reference, describes a 50 nm thick single walled carbon nanotube (SWNT) film deposited on a quartz substrate, which provides $T_\lambda > 70\%$ in the visible and $T_\lambda \sim 80\%$-95% in near infrared (NIR) with $\rho = 150$ $\mu\Omega$ cm ($R_s = 30$ $\Omega$/sq.), and also describes a 240 nm thick SWNT free-standing film, which provides $T_\lambda \sim 6$-35% in the visible and $T_\lambda \sim 6\%$-86% over a 400 nm-20 $\mu$m wavelength with no information on $\rho$ or $R_s$. "Infrared transparent carbon nanotube thin films", *Appl. Phys. Lett.* 94, 081103 (2009), incorporated herein by reference, describes a 25 nm thick carbon nanotube (CNT) film deposited on a quartz substrate, which provides $T_\lambda$ ~70-82% in the visible, $T_\lambda$ ~82%-94% in Near Infrared-short wave infrared (SWIR), and $T_\lambda$ ~94%-85% in 2.5 $\mu$m-20 $\mu$m wavelength range with $R_s$=200 $\Omega$/sq.

"Prospects for nanowire-doped Polycrystalline graphene films for ultratransparent, highly conductive electrodes", *Nano Letters* 11, 5020 (2011), incorporated herein by reference, describes a theoretical simulation predicting $R_s$ and $T_\lambda$ in the visible spectrum for a hybrid system using Ag NW doped with graphene, and describes such a hybrid system for high performance transparent conductors. The simulation results indicate that both $R_s$ and its variation can be significantly improved by using the hybrid system without a loss of transmittance. "Improved electrical conductivity of graphene films integrated with metal nanowires", *Nano Letters* 12, 5679 (2012), incorporated herein by reference, describes graphene films integrated with Ag NWs that provide $R_s$=30-80 $\Omega$/sq. for $T_\lambda \sim 90\%$ at 550 nm. "Hybrid Transparent conductive film on flexible glass formed by hot-pressing graphene on a silver nanowire mesh", *ACS Applied Materials & Interfaces* 5, 11756 (2013), incorporated herein by reference, describes a hot-pressed graphene film on an Ag NW mesh prepared on a flexible glass substrate, demonstrating $R_s \sim 14$ $\Omega$/sq. and $T_\lambda \sim 90\%$ at 550 nm.

"High-performance, Transparent, and stretchable electrodes using Graphene-Metal nanowire Hybrid Structure", *Nano Letters* 13, 2814 (2013), incorporated herein by reference, describes Ag NW-graphene hybrid films which provide $T_\lambda \sim 94\%$ in the 400 nm-1.5 $\mu$m wavelength range with $R_s \sim 33$ $\Omega$/sq., and describes Ag NW-graphene hybrid electrodes fabricated on an InZnGaO (IZGO) film.

Although the prior art describes electrical contacts and interconnects that are transparent for some wavelengths, what is needed is electrical contacts and interconnects, and/or grids that are transparent over visible to LWIR wavelengths. The embodiments of the present disclosure address these and other needs.

SUMMARY

In a first embodiment disclosed herein, a method for fabricating an optically transparent conductor comprises depositing a plurality of metal nanowires on a substrate, annealing or illuminating the plurality of metal nanowires to thermally or optically fuse nanowire junctions between metal nanowires to form a metal nanowire network, disposing a graphene layer over the metal nanowire network to form a nanohybrid layer comprising the graphene layer and the metal nanowire network, depositing a dielectric passivation layer over the nanohybrid layer, patterning the dielectric passivation layer using lithography, printing, or any other method of patterning to define an area for the optically transparent conductor, and etching the patterned dielectric passivation layer to form the optically transparent conductor.

In another embodiment disclosed herein, a method for fabricating an optically transparent conductor comprises growing a first graphene layer by chemical vapor deposition (CVD), transferring the first graphene layer onto a substrate, depositing a plurality of metal nanowires over the first graphene layer, annealing or illuminating the plurality of metal nanowires to thermally or optically fuse nanowire junctions between metal nanowires to form a metal nanowire network, the first graphene layer and the metal nanowire network forming a nanohybrid layer, depositing a dielectric passivation layer over the nanohybrid layer, patterning the dielectric passivation layer using lithography, printing, or any other method of patterning to define a desired area for the optically transparent conductor, and etching the patterned dielectric passivation layer to form the optically transparent conductor.

In yet another embodiment disclosed herein, an optically transparent conductor comprises a plurality of metal nanowires on a substrate having fused junctions between the metal nanowires, the plurality of metal nanowires having fused junctions forming a metal nanowire network, a graphene layer disposed on the metal nanowire network, the graphene layer disposed on the metal nanowire network forming a nanohybrid layer of the graphene layer and the metal nanowire network; and a dielectric passivation layer disposed on a portion of the nanohybrid layer.

In still another embodiment disclosed herein, an optically transparent conductor comprises a first graphene layer disposed on a substrate, a plurality of metal nanowires disposed on the first graphene layer, the plurality of metal nanowires having fused junctions between the metal nanowires, the plurality of metal nanowires having fused junctions forming a metal nanowire network, and the first graphene layer and the metal nanowire network forming a nanohybrid layer; and a dielectric passivation layer disposed on a portion of the nanohybrid layer.

In still yet another embodiment disclosed herein, an optically transparent conductor comprises a first graphene layer disposed on a substrate, a plurality of metal nanowires disposed on the first graphene layer, the plurality of metal nanowires having fused junctions between the metal nanowires, the plurality of metal nanowires having fused junctions forming a metal nanowire network, a second graphene layer disposed on the metal nanowire network, the first graphene layer, the metal nanowire network, and the second graphene layer disposed on the metal nanowire network forming a nanohybrid layer, and a dielectric passivation layer disposed on an area of the nanohybrid layer.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 2C and 2D show the optical transmittance of graphene transferred on a GaAs substrate, and FIGS. 2E and 2F show the optical transmittance of an Ag NW network compared to the optical transmittance of the optically transparent nanohybrid (All-λ) conductor in accordance with the present disclosure;

FIG. 3A shows a SEM image of graphene transferred onto a substrate, FIG. 3B shows a SEM image of a metal nanowire network, FIG. 3C shows a SEM image of a nanohybrid of graphene and a Ag NW network, and FIG. 3D shows a SEM image of a proof-of-concept optically transparent contact integrated on an InAsSb IR detector in accordance with the present disclosure;

FIGS. 4A, 4B, 4C, 4D, 4E, 4F, 4G, 4H, 4I, 4J, 4K and 4L show a fabrication process for forming a nanohybrid of graphene and metal nanowire network to form optically transparent contacts, grids and interconnects in accordance with the present disclosure;

FIG. 6A shows an energy band diagram of silver (Ag) on n+ InAsSb, and FIG. 6B shows an Ag (silver) ohmic contact on n+ InAsSb in accordance with the present disclosure;

FIG. 7A shows a graphene ohmic contact on n+ InAsSb and FIG. 7B shows a corresponding energy-band diagram in accordance with the present disclosure;

FIG. 9A shows a graph for dark current and FIG. 9B shows a graph for photo current of a front side-illuminated InAsSb detector integrated with Ag NW ITC contacts in accordance with the present disclosure compared to detectors with conventional metal contacts.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In the present disclosure, optically transparent electrical conductors, interconnects, and contacts and grids are described with a metal nanowire network integrated with graphene that have an optical transmittance $T_\lambda > 92\%$ in a wide wavelength range of visible to long wavelength IR with a low sheet resistance $R_s < 20$ Ω/sq., providing radiation-hardness and chemical and mechanical stability. The optically transparent electrical contacts according to the present disclosure have a low contact resistance, e.g. specific contact resistivity $R_s$ of less than $10^{-5}$ Ωcm². Wafer-level, large area optical pixel arrays with a read-out integrated circuit (ROIC) may be integrated with the optically transparent electrical conductors, interconnects, and contacts and grids. High density and ultra large format FPAs may also be integrated with the optically transparent electrical conductors, interconnects, contacts and grids. Three dimensional (3D) optically transparent electrical contacts and interconnects may be formed including through-silicon-vias (TSVs), through-compound semiconductor-via (TCSVs) and micrometer-scale interconnect patterns on semiconductor surfaces.

The optically transparent contacts, interconnects, and grids described in this disclosure address the limitations of nontransparent metal contacts/grid lines and interconnects, and allow high collection efficiency of photoelectrons over the entire pixel area, realizing a high fill-factor and high overall quantum efficiency (QE) in scaled high density, large-format focal plane arrays (FPAs), which may have formats greater than 5K×5K. With nearly the full area of a pixel available for photon detection and collection of photoelectrons and with the pixel fill factor approaching unity, the optically transparent contacts, interconnects and grids of the present disclosure improve external quantum efficiency (QE) and noise-equivalent power (NEP) over the prior art, which improves operational utility in low-light and low-contrast conditions. The present disclosure also enables high-performance (i.e., external QE approximately equals internal QE) in small (≤wavelength-sized) pixels integrated in 3D.

Figure 1B:
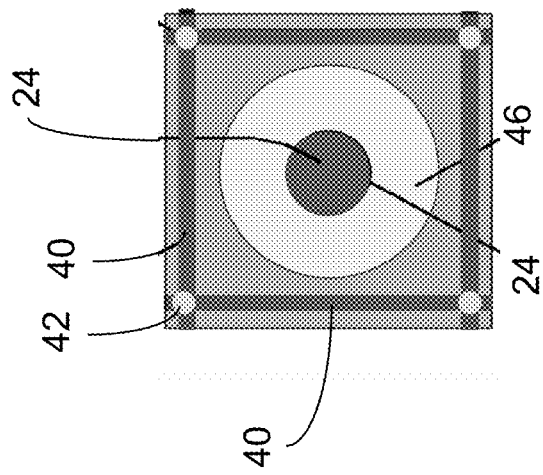
FIG. 1A shows a high-density detector array fabricated with optically transparent electrical contacts and interconnects for 3D heterogeneous integration with a read-out integrated circuit (ROIC) and FIG. 1B shows an optically transparent contacts, grid and interconnects on a front side-illuminated vertically integrated IR pixel in accordance with the present disclosure.
Figure 1A:
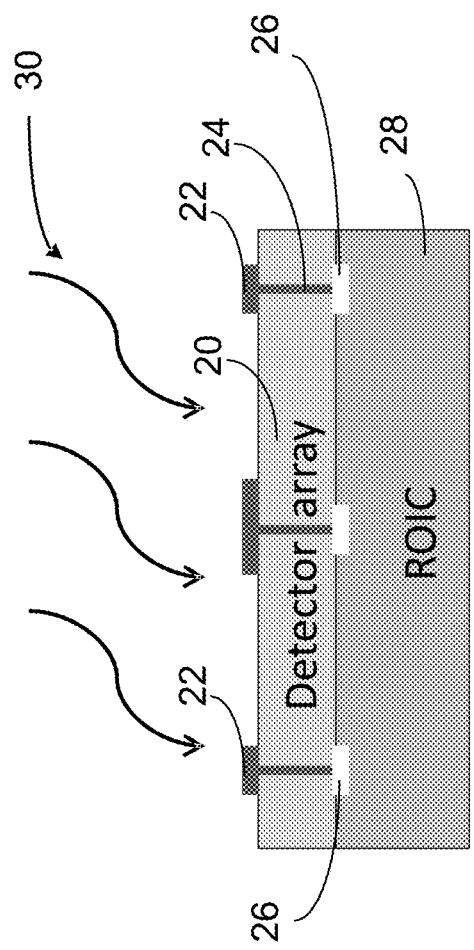

FIG. 1A shows a high-density detector array fabricated with optically transparent electrical contact and interconnects, and 3D heterogeneous integration with a read-out integrated circuit (ROIC) in accordance with the present disclosure. The high-density detector array of FIG. 1A is a front side illuminated detector array 20 for detecting illumination 30. The detector array 20, which may be a focal plane array, has optically transparent electrical contacts 22 on its surface, and optically transparent interconnects 24 connected to electrical contacts 22 and to electrical contacts 26 on a read-out integrated circuit (ROIC) 28. The electrical contacts 26 on the ROIC may be metal. Each contact 22 conducts electrical signals from a pixel detector, which may be a visible or IR detector, to an electrical contact 26 on the ROIC 28 by way of an optically transparent electrical interconnect 24. The three dimensional (3D) heterogeneous integration of the focal plane array 20 with the read-out integrated circuit (ROIC) 28 provides a compact volume. The optically transparent contacts 22 and interconnects 24 replace conventional nontransparent metal contacts/interconnects used in the prior art. As a result, the external quantum efficiency (QE) and signal-to-noise ratio (SNR) of the IR detectors in the FPA 20 are enhanced.

FIG. 1B shows a front side illuminated vertically integrated infrared (IR) pixel with grid 40 and contacts 42 around the pixel. The IR pixel has an N-type region 46 surrounding an optically transparent electrical interconnect 24, according to the present disclosure. Such a pixel is described in "Development of Molecular Beam Epitaxially Grown Hg1-xCdxTe for High-Density Vertically-Integrated Photodiode-Based Focal Plane Arrays", Journal of ELECTRONIC MATERIALS, Vol. 36, No. 8, 2007, which is incorporated herein by reference; however, the grid 40, contacts 42 and electrical interconnect 24 are not optically transparent in this prior art reference. In the present disclosure the grid 40, the contacts 42 and the electrical interconnect 24 are made of optically transparent material, and therefore the optical transmittance and the performance of the pixel are improved over the prior art.

The optically transparent contacts, interconnects and grids of the present disclosure are based on nanohybrid co-percolating electrical conductors made of metal nanowire networks integrated with graphene, which provide the combined benefit of a high optical transmittance $T_\lambda$ greater than 92% over a broadband visible-LWIR wavelength range and a low sheet resistance $R_s$ of less than 20 Ω/sq. Without implying a limitation, the graphene may be grown using chemical vapor deposition (CVD).

Figure 2B:
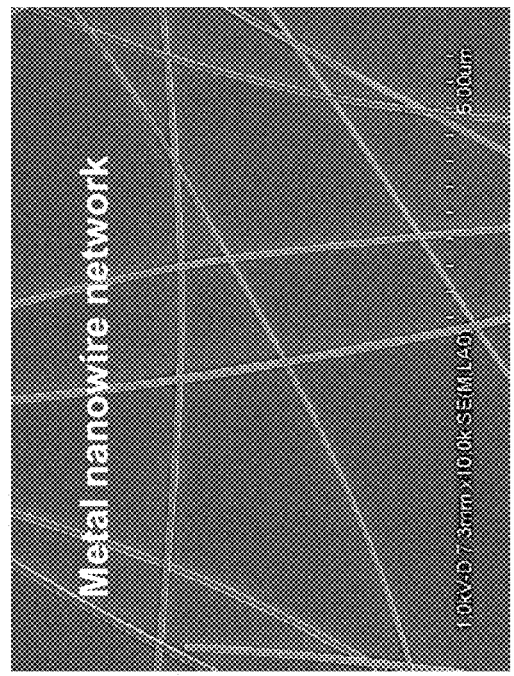
FIG. 2B shows a scanning electron microscope (SEM) image of an Ag nanowire (NW) network.
Figure 2A:
FIG. 2A shows an atomic force microscope (AFM) image of graphene transferred on a substrate.

FIG. 2A shows an atomic force microscope (AFM) image of graphene transferred onto a substrate, and FIG. 2B shows a scanning electron microscope (SEM) image of an Ag NW network. In this disclosure, a metal NW network, such as that shown in FIG. 2B is integrated with the graphene shown in FIG. 2A.

FIGS. 2C and 2D show the optical transmittance of graphene transferred on a GaAs substrate. It may be seen in FIGS. 2C and 2D that graphene with a sheet resistance Rs of 500 to 900 ohms/sq. has a transmittance greater than about 95% from visible to long wavelength infrared (IR) wavelengths. FIGS. 2E and 2F show the optical transmittance of an Ag NW network compared with the optical transmittance of an Ag NW network integrated with graphene in accordance with the present disclosure. The Ag NW network has a sheet resistance Rs of 19 ohms/sq. and has a decreased transmittance in the 2 µm to 17 µm wavelength range. However, a metal NW network integrated with graphene in accordance with the present disclosure, which also may have a sheet resistance Rs of 19 ohms/sq., has an optical transmittance that is higher than the optical transmittance of the Ag NW network in the 2 µm to 17 µm wavelength range, and an optical transmittance that is greater than 92% over the 0.9 µm to 17 µm wavelength range.

While the optically transparent contacts, interconnects and grids of the present disclosure have advantages for a wide range of optoelectronics devices, they may be most beneficial for front side-illuminated and 3D-integrated, small (less than or equal to wavelength-sized) pixels, especially for operations from medium wavelength infrared (MWIR) to long wavelength IR (LWIR).

The optically transparent contacts, interconnects and grids of the present disclosure may be formed by transferring a chemical vapor deposition (CVD) of graphene layer over a metal nanowire network, forming a metal nanowire network over a CVD layer of graphene, or forming a metal nanowire network between two CVD layers of graphene. The CVD graphene may be a monolayer of graphene. The metal nanowire network, which may be any metal including Ag, Au, Cu, and Ni can be formed by spin-coating, electrospinning, spraying, or printing the metal on thin film or rigid IR detector substrates, which may be for example InAsSb-based detectors for MWIR, InAs/GaSb superlattice (SL) detectors for LWIR, or HgCdTe-based detectors for MWIR to LWIR.

FIG. 3A shows a SEM image of chemical vapor deposition (CVD) graphene transferred onto a structured substrate, and FIG. 3B shows a SEM image of a metal nanowire network. FIG. 3C shows a SEM image of a nanohybrid of graphene and a Ag NW network to make an optically transparent contact, interconnect, or grid line, and FIG. 3D shows a SEM image of a proof-of-concept InAsSb IR detector with an optically transparent electrical contact in accordance with the present disclosure.

Figure 4A:
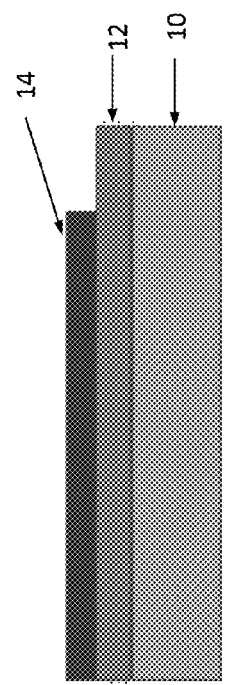
Figure 4B:
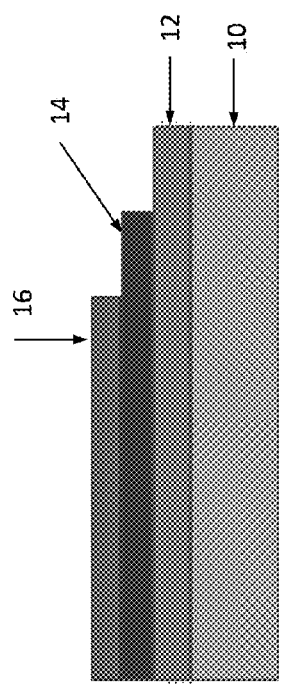
Figure 4C:
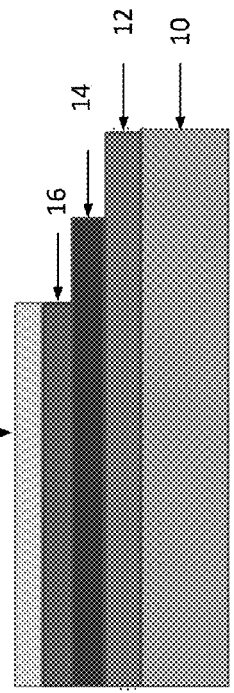
Figure 4D:
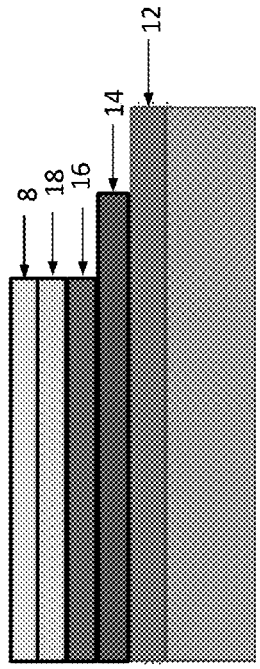

FIG. 4A to 4F show a process flow for fabricating optically transparent electrical contacts, which may be ohmic contacts, grids, and interconnects in accordance with the present disclosure. The process begins with a IR detector 12, which may be fabricated on a substrate wafer 10, as shown in FIG. 4A. Then one or more metal nanowire network 14 are deposited on the IR detector 12 and annealed in a vacuum or in an inert gas, or illuminated with an infrared lamp or a halogen lamp in a vacuum or in an inert gas, to thermally or optically fuse metal nanowire junctions in the metal nanowire networks to achieve low junction resistance and consequently a low sheet resistance $R_s$ for the metal nanowire network 14, as shown in FIG. 4A. Then a graphene layer 16 is transferred to the metal nanowire network 14 to form a nanohybrid layer of graphene and the metal nanowires, as shown in FIG. 4B. The graphene layer may be ultrathin and have a thickness of less than 10 Å.

Figure 10A:
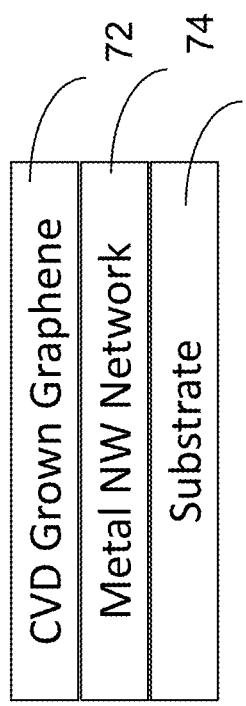
FIGS. 10A, 10B, and 10C show different configurations for fabricating an optically transparent conductor in accordance with the present disclosure.
Figure 10C:
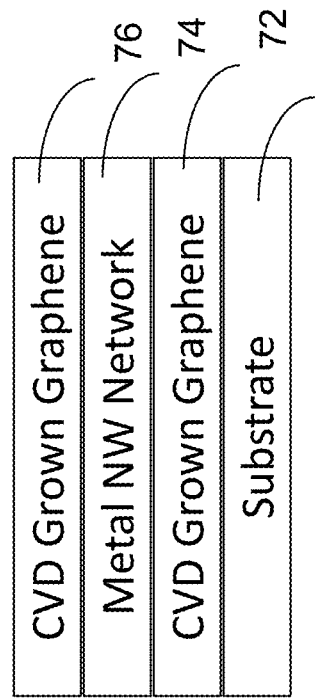
Figure 10B:
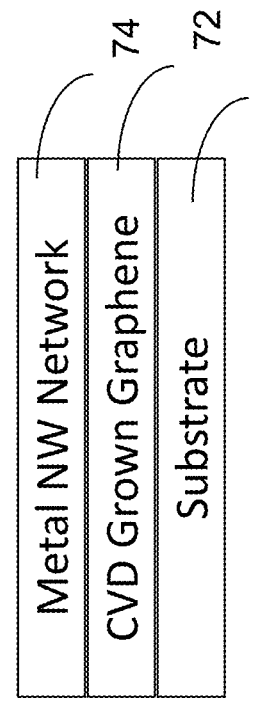

FIGS. 10A, 10B, and 10C show different nanohybrid layers on a substrate in accordance with the present disclosure. FIG. 10A shows a substrate 70 with a metal nanowire network 74 on the substrate and a CVD grown layer of graphene 72 transferred onto the metal nanowire network 74 to form the nanohybrid layer, as described above. The graphene layer 72 may be ultrathin and have a thickness of less than 10 Å. A nanohybrid layer of graphene and the metal nanowires may be also formed by first transferring a CVD grown graphene layer 72 onto the substrate 70 followed by depositing a metal nanowire network 74 over the graphene layer 72, as shown in FIG. 10B. A nanohybrid layer of graphene and the metal nanowires may be also formed by first transferring a first CVD grown graphene layer 72 onto the substrate 70, depositing a metal nanowire network 74 over the graphene layer 72, and then transferring a second chemical vapor deposition (CVD) grown graphene layer 76 over the metal nanowire network 74, as shown in FIG. 10C. The graphene layer 76 may be ultrathin and have a thickness of less than 10 Å.

Figure 4E:
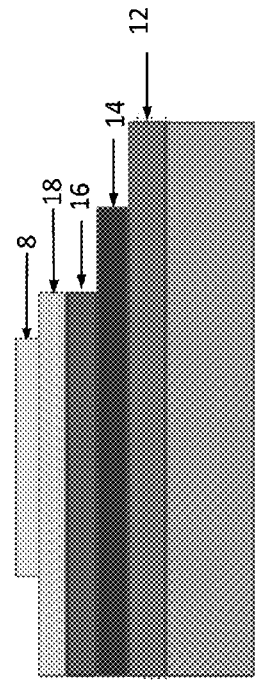
Figure 4F:
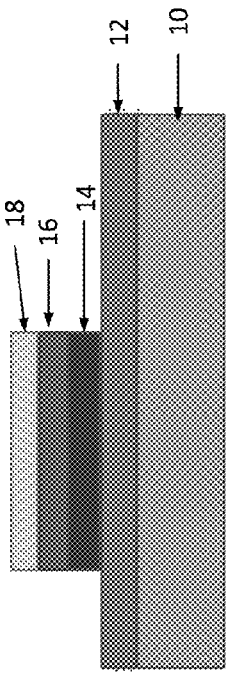

Returning to FIG. 4C after the nanohybrid layer (14, 16) is formed, a dielectric passivation layer 18, which may be $Al_2O_3$ grown with atomic-layer-deposition (ALD), is deposited over the nanohybrid layer (14, 16) for chemical and mechanical stability of the nanohybrid layer (14, 16), as shown in FIG. 4C. The ALD grown dielectric passivation layer 18, which may be $Al_2O_3$, has excellent adhesion to IR detector 12 surfaces. Then the passivation layer is patterned with a suitable mask 8 using lithography, printing, or any other method of patterning, as shown in FIG. 4-D. Next dry or wet etching may be used to form specific shapes and dimensions of optically transparent electrical contacts, grids, or electrical interconnects from the nanohybrid layer, as shown in FIG. 4F. The step of patterning the passivated nanohybrid layer, for example, covers portions of the passivated nanohybrid layer, as shown in FIG. 4E. Then as shown in FIG. 4F, the unpatterned portion of the nanohybrid layer is etched. Then the pattern 8 is removed to expose the contacts, grids and interconnects of the nanohybrid layer (14, 16). Then the optically transparent electrical contacts, grids, and interconnects may optionally be annealed using rapid thermal annealing.

FIGS. 4G, 4H, 4I, 4J, 4K and 4L show another view of the formation process for the transparent electrical contacts, girds, and interconnects.

As discussed above in reference to FIG. 10B, in an alternate process for forming the nanohybrid layer, the CVD-grown graphene layer 16 may first be transferred to the IR Detector layer 12, and then a metal nanowire layer 14 may be deposited on the graphene layer 16. Also as discussed in reference to FIG. 10C, in another process for forming the nanohybrid layer, first a graphene layer 16 is deposited on the IR Detector layer 12, then the metal nanowire layer 14 is deposited on the first graphene layer 16, and then a second graphene layer 16 may be deposited on the metal nanowire 14. The graphene layer or layers 16 and the metal nanowire layer 14 may be annealed. The remaining process steps would be as shown in FIGS. 4C, 4D, 4E and 4F.

Figure 5B:
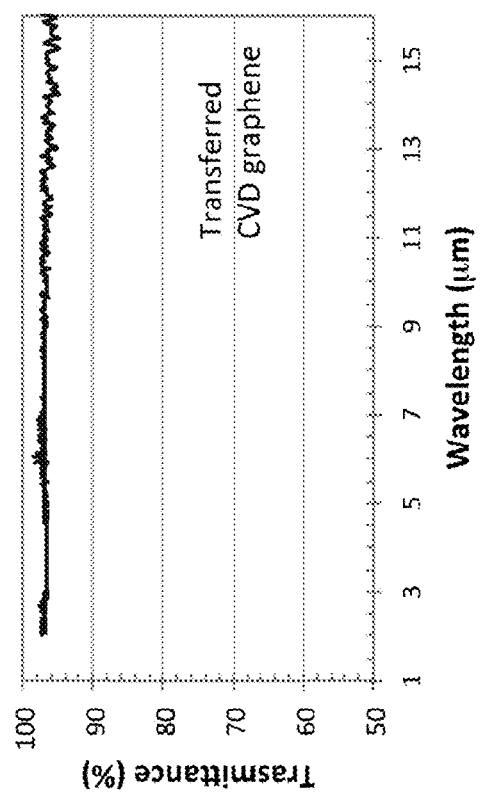
FIGS. 5A and 5B show the optical transmittance of chemical vapor deposition (CVD) graphene transferred onto a GaAs substrate in accordance with the present disclosure.
Figure 5A:
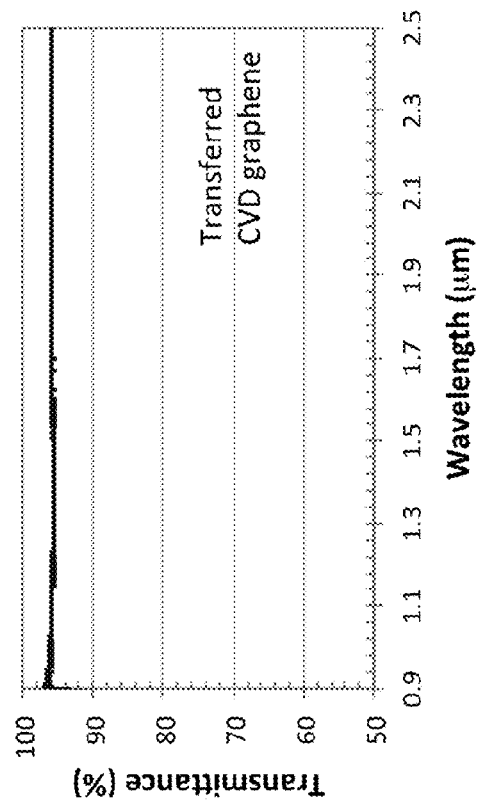

FIGS. 5A and 5B show the infrared transmittance of CVD graphene transferred on a GaAs substrate. As shown, the CVD graphene transferred on the GaAs substrate has an optical transmittance of $T_\lambda > 95\%$ over the near infrared (NIR) to LWIR wavelength range. The resistivity $R_s$ ranges from about 600-1000 Ω/sq. Over the entire IR wavelength range, the nanohybrid optically transparent contacts, grids and interconnects may have an optical transmittance $T_\lambda$ greater than 92% with a resistivity $R_s$ of about 19 Ω/sq.

The nanohybrid layers of metal nanowires and graphene, make good ohmic contacts to IR detector surfaces. For example, a nanohybrid layer consisting of silver networks (Ag NWs) and graphene forms a good ohmic contact to a n+ InAsSb top contact layer of InAsSb-based MWIR detectors and to the p+ GaSb top contact layer of a InAs/GaSb superlattice (SL) based LWIR detector. Given the work function $\phi$ of ~4.26 eV of Ag, it is feasible to make ohmic contacts between Ag NWs and highly doped n+ InAsSb with a work function $\phi$ of ~4.9 eV. FIG. 6A shows an energy band diagram of silver (Ag) on n+ InAsSb, as shown in FIG. 6B.

InAsSb has a band gap of 0.17-0.35 eV and a work function $\phi$ of ~4.9 eV. It is well known that In with $\phi$~4.12 eV and Te with $\phi$ of ~5 eV can make a good ohmic contact to n+ InAsSb. With the work function of $\phi$~4.5 eV for graphene, which is in between the work functions of In and Te, graphene makes a good ohmic contact to n+ InAsSb. FIG. 7A shows a schematic of a graphene ohmic contact on n+ InAsSb and FIG. 7B shows a corresponding energy-band diagram, where the work function difference is $\Delta\Phi = \Phi_{Graphene} - \Phi_{InAsSb} = 4.5$ eV$-4.9$ eV$=-0.4$ eV. Charge transfer occurs between the n+ InAsSb and graphene to align to Fermi levels. This results in the effective p-doping of the graphene, which further reduces the sheet resistance. The effective p-doping density ($\Delta n$) in the graphene layer can be analyzed using an electrostatic capacitor model and the work function difference of ~0.4 eV, which leads to a transfer of $~5 \times 10^{12}$ cm$^{-2}$ holes into the graphene layer, as described by J. S. Moon et al in "Ultra-low resistance ohmic contacts in graphene field effect transistors" in Appl. Phys. Lett. 100, 203512 (2012), incorporated herein by reference, which results in p-type doping of the graphene material.

Typical contact resistivity of a conventional metal over an n+ InAsSb layer is in the $10^{-6}$ Ω·cm$^2$ range. Electrical contacts made of graphene onto an n+ InAsSb layer can form excellent ohmic contacts, reaching to the theoretical Sharvin limit.

The optional rapid thermal annealing, described above with reference to FIG. 4F, may be performed at a low-temperature of less than 200° C. in nitrogen and provides good ohmic contacts to InAsSb detectors without damaging the InAsSb detector materials. For InAs/GaSb-based LWIR detectors with a superlattice (SL) absorber, the nanohybrid layers of metal nanowires and graphene make good ohmic contacts to a Be-doped p+ GaSb layer (Eg=0.72 eV). The work function difference in this case is $\Delta\Phi = \Phi_{Graphene} - \Phi_{GaSb} = 4.5$ eV$-4.8$ eV$=-0.3$ eV. Charge transfer between the p+ GaSb and graphene results in effective p-doping of the graphene, reducing the sheet resistance of the graphene further and further improves the ohmic contacts to the p+ GaSb top contact layer.

In advanced IR detector architectures for high density (HD) and large-scale FPAs, IR detectors may be heterogeneously integrated with read-out-integrated circuits (ROICs) using 3D interconnects designed with through-compound semiconductor vias (TCSV). TCSV-based 3D interconnects that have been demonstrated consist of top metal contacts to detector surfaces, TCSVs coated with metal films, and bottom metal contacts to ROICs. The optically transparent interconnects disclosed herein may be fabricated by integrating metal nanowires to the top metal contacts and sidewalls of the TCSVs first and then transferring CVD graphene over the metal nanowire networks. The bottom contacts may be made with either optically transparent electrical conductors according to the present disclosure or conventional metal films depending on the detector architectures, for higher optical efficiency of specific IR detectors.

Figure 8A:
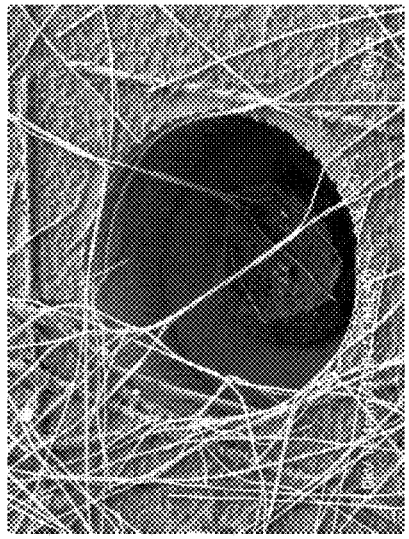
FIG. 8A shows a scanning electron microscope (SEM) image of a 3D via chain fabricated by integrating Ag NWs to via holes created in a benzocyclobutene (BCB) film, as shown in FIGS. 8B and 8C, in accordance with the present disclosure.
Figure 8B:
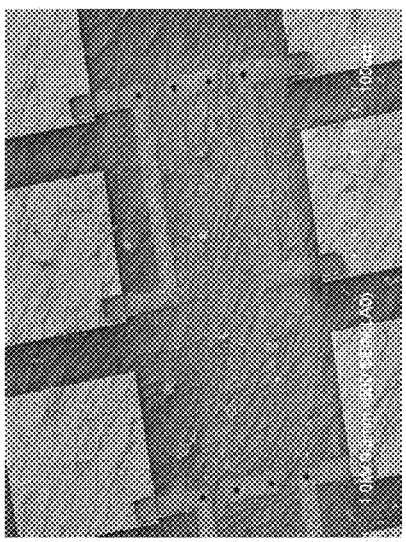
Figure 8C:
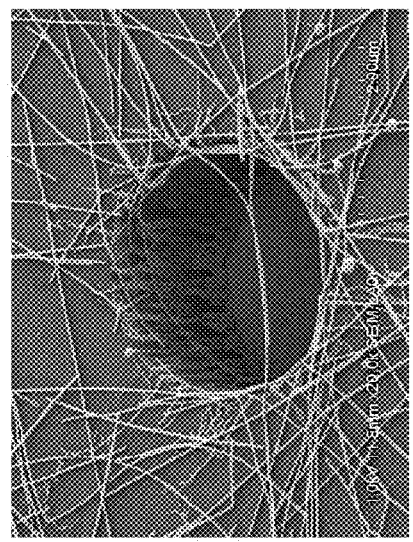

FIGS. 8A to 8C illustrate a fabrication process for through-compound semiconductor vias (TCSV) integrated with the optically transparent electrical contacts and interconnects of the present disclosure. FIG. 8A shows a SEM image of a 3D via chain fabricated by integrating Ag NWs to via holes created in a BCB film, as shown in FIGS. 8B and 8C. Then CVD graphene is transferred over the Ag NWs to form a nanohybrid layer of graphene and the Ag NWs. Next the nanohybrid layer of graphene and the Ag NWs may be passivated with an ALD dielectric film. For the vias shown in FIGS. 8B and 8C, Ag NWs are formed using spin-coating; however, spraying or electrospinning methods may also be used. For higher fabrication yield, ultra thin metal films grown with ALD can be deposited on the sidewall of the vias before the step of depositing the Ag NW network.

The disclosed optically transparent contacts, interconnects, and grids have a radiation-hardness and thermal stability that are critically needed for IR FPAs operating in space environments. The graphene is minimally impacted by ionizing and displacement radiation due to its ultrathin (less than 10 Å) thickness and its low atomic number, which provides a small scattering cross section. Metal nanowire networks formed with metal nanowires or metal nano-half tube networks are naturally radiation-hard. The nanohybrid layers of graphene and metal nanowire networks are therefore are stable against ionizing radiations, for example a total ion dose (TID) of greater than 200 krad. The nanohybrid layers are resistant to significant damage from displacement radiation. Also, graphene has excellent electron and hole mobilities, and therefore ohmic contact charge trapping is not a concern, assuming that the graphene/IR photodiodes ohmic contacts are cleanly processed without any organic residue.

The disclosed optically transparent contacts, grids, and interconnects are also thermally and chemically stable. By passivating with an ALD-grown dielectric, such as $Al_2O_3$, the optically transparent contacts, grids, and interconnects are made chemically inert. Ag NW networks and ohmic contacts have been tested successfully under thermal cycles of 80 K to 300 K, and operations of Ag network (NW) based IR-transparent conductors (ITCs) have been demonstrated at 120K and 150 K. Graphene is well known to work down to cryogenic temperatures (<1K) without carrier freeze out, and graphene's electrical performance is known to improve upon cooling. Given a condition that the thermal expansion coefficient mismatch between the optically transparent contacts, grids and interconnects of the present disclosure and an IR detector surface is not significant, the optically transparent contacts, grids and interconnects of the present disclosure fabricated on MWIR and LWIR detectors are stable in the operating temperature conditions of IR FPAs.

Ag NW ITC contacts have been successfully demonstrated using prototype InAsSb MWIR detectors with front side-illuminated photodiodes, resulting in clearly improved external QE. In Ag NW networks with $T_\lambda$~80-90%, typical spacing between neighboring Ag NWs is in the range of micrometers, resulting in micrometer-sized voids in the Ag NW networks. An ideal contact to photodetectors is an optically transparent continuous film covering nearly the entire area of a pixel with a very low sheet resistance. Optically transparent contacts according to the present disclosure consisting of a continuous graphene layer integrated with a metal nanowire network address the limitations of Ag NW networks with the added benefit of exceptionally high carrier mobility within the graphene layer. Optically transparent contacts covering almost the entire area of IR pixels with an optical transmittance $T_\lambda$>92% and a sheet resistance $R_s$<19 Ω/sq. can enable a pixel external QE to be close to the internal QE, regardless of the detector fill factor. This is a very significant advantage for IR pixel scaling over pixels with metal contacts, because the metal contacts can only be reduced to a certain level, for example a 1-2 um contact size for a 5 um pixel, inevitably resulting in the decrease of detector fill factor, and a decrease in QE.

The optically transparent contacts, interconnects, and grids of the present disclosure enable pixel scaling without compromising QE, responsivity, and other detector performances. FIG. 9A shows a graph for dark current and FIG. 9B shows a graph for photo current of a front side-illuminated InAsSb detector integrated with a metal contact or an Ag NW based IR-transparent conductor (ITC) contact. The dark current shown in FIG. 9A for the Ag NW ITC contact integrated detector, shown in curve 60, is nearly the same as the dark current for the metal contact-integrated detectors, shown in curve 62, which indicates that an Ag NW ITC makes good ohmic contacts to InAsSb detectors. For 200 μm×200 μm detectors with 150 μm×150 μm contacts, FIG. 9B shows an approximately 31% increase in photocurrent with Ag NW ITC contacts, shown in curve 66 compared to the photocurrent for metal contacts, shown in curve 64. The optically transparent interconnects and contacts of the present disclosure enable small pitch IR pixels with external QEs close to their internal QEs, due to their excellent optical transmittance $T_\lambda$>92% in the visible to LWIR wavelength range and their low contact resistance, for example specific contact resistivity $R_c$ of less than $10^{-5}$ $\Omega cm^2$ to an IR detector substrate.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for fabricating an optically transparent conductor, the method comprising:
   depositing a plurality of metal nanowires on a substrate;
   annealing or illuminating the plurality of metal nanowires to thermally or optically fuse nanowire junctions between metal nanowires to form a metal nanowire network;
   disposing a graphene layer over the metal nanowire network to form a nanohybrid layer comprising the graphene layer and the metal nanowire network;
   depositing a dielectric passivation layer over the nanohybrid layer;
   patterning the dielectric passivation layer using lithography, printing, or any other method of patterning to define an area for the optically transparent conductor; and
   etching the patterned dielectric passivation layer to form the optically transparent conductor; wherein the optically transparent conductor has a transmittance greater than 92% over the entire range extending from the near infrared to the long wavelength infrared.

2. The method of claim 1 wherein the optically transparent conductor comprises an electrical contact, an ohmic contact, a grid, or an electrical interconnect.

3. The method of claim 1 wherein:
   annealing comprises annealing in a vacuum or in an inert gas;
   illuminating comprises illuminating with an infrared lamp or a halogen lamp in a vacuum or in an inert gas; and
   etching comprises dry or wet etching.

4. The method of claim 1 wherein:
   the optically transparent conductor has a sheet resistance Rs of less than 20 ohms/sq.

5. The method of claim 1 wherein:
   the dielectric passivation layer comprises Al2O3 grown using atomic-layer-deposition (ALD).

6. The method of claim 1 wherein:
   the metal nanowires comprise Ag, Au, Cu, or Ni and combinations thereof, or any other metal nanowires formed by spin-coating, electrospinning, spraying, or printing.

7. The method of claim 1 wherein:
   the substrate comprises a InAsSb detector for medium wavelength infrared, an InAs/GaSb superlattice detector for long wavelength infrared, or a HgCdTe-based detector for medium wavelength infrared to long wavelength infrared.

8. The method of claim 1 wherein the graphene comprises monolayer graphene, or the graphene has a thickness of less than 10 Å.

9. The method of claim 1 wherein the substrate comprises GaAs, InAsSb, InAs, GaSb or HgCdTe.

10. The method of claim 1 wherein the entire range extending from the near infrared to the long wavelength infrared comprises the wavelength range of between 0.9 μm to 17 μm.

11. A method for fabricating an optically transparent conductor, the method comprising:
   growing a first graphene layer by chemical vapor deposition (CVD);
   transferring the first graphene layer onto a substrate;
   depositing a plurality of metal nanowires over the first graphene layer;
   annealing or illuminating the plurality of metal nanowires to thermally or optically fuse nanowire junctions between metal nanowires to form a metal nanowire network, the first graphene layer and the metal nanowire network forming a nanohybrid layer;
   depositing a dielectric passivation layer over the nanohybrid layer;
   patterning the dielectric passivation layer using lithography, printing, or any other method of patterning to define a desired area for the optically transparent conductor; and
   etching the patterned dielectric passivation layer to form the optically transparent conductor; wherein the optically transparent conductor has a transmittance greater than 92% over the entire range extending from the near infrared to the long wavelength infrared.

12. The method of claim 11 further comprising:
   before depositing said dielectric passivation layer, transferring a second graphene layer over the metal nanowire network wherein the nanohybrid layer comprises the first graphene layer, the metal nanowire network, and the second graphene layer.

13. The method of claim 12 wherein:
   the first graphene layer comprises monolayer graphene, or the graphene has a thickness of less than 10 Å; and
   the second graphene layer comprises monolayer graphene, or the graphene has a thickness of less than 10 Å.

14. The method of claim 11 wherein the optically transparent conductor comprises an electrical contact, an ohmic contact, a grid, or an electrical interconnect.

15. The method of claim 11 wherein:
   annealing comprises annealing in a vacuum or in an inert gas;
   illuminating comprises illuminating with an infrared lamp or a halogen lamp in a vacuum or in an inert gas; and
   etching comprises dry or wet etching.

16. The method of claim 11 wherein:
   the optically transparent conductor has a sheet resistance Rs of less than 20 ohms/sq.

17. The method of claim 11 wherein:
   the dielectric passivation layer comprises Al2O3 grown using atomic-layer-deposition (ALD).

18. The method of claim 11 wherein:
   the metal nanowires comprise Ag, Au, Cu, or Ni, and combinations thereof, or any other metal nanowires formed by spin-coating, electrospinning, spraying, or printing.

19. The method of claim 11 wherein:
   the substrate comprises a InAsSb detector for medium wavelength infrared, an InAs/GaSb superlattice detector for long wavelength infrared, or a HgCdTe-based detector for medium wavelength infrared to long wavelength infrared.

20. The method of claim 11 wherein the substrate comprises GaAs, InAsSb, InAs, GaSb or HgCdTe.

21. The method of claim 11 wherein the entire range extending from the near infrared to the long wavelength infrared comprises the wavelength range of between 0.9 μm to 17 μm.

* * * * *